(12) United States Patent
Matsuura (10) Patent No.: US 9,063,200 B2
(45) Date of Patent: Jun. 23, 2015

(54) BATTERY PACK, METHOD OF DETERMINING MALFUNCTION, AND A MALFUNCTION DECISION CIRCUIT

(75) Inventor: Shinichi Matsuura, Sumoto (JP)

(73) Assignee: SANYO ELECTRIC CO., LTD., Osaka (JP)

( * ) Notice: Subject to any disclaimer, the term of this patent is extended or adjusted under 35 U.S.C. 154(b) by 494 days.

(21) Appl. No.: 13/455,473

(22) Filed: Apr. 25, 2012

(65) Prior Publication Data

US 2012/0274335 A1    Nov. 1, 2012

(30) Foreign Application Priority Data

Apr. 28, 2011    (JP) .................................. 2011-102302

(51) Int. Cl.
| | |
|---|---|
| *G01R 31/02* | (2006.01) |
| *G01R 31/36* | (2006.01) |
| *G01R 19/165* | (2006.01) |
| *H01M 10/42* | (2006.01) |
| *G01R 35/00* | (2006.01) |

(52) U.S. Cl.
CPC ...... *G01R 31/3624* (2013.01); *G01R 19/16542* (2013.01); *G01R 35/00* (2013.01); *H01M 10/425* (2013.01); *H01M 10/4257* (2013.01); *H01M 10/4285* (2013.01)

(58) Field of Classification Search
CPC ................... G01R 19/16542; G01R 19/16547; G01R 31/3658
USPC .......... 324/433–434, 537–538; 320/112–115; 429/90
See application file for complete search history.

(56) References Cited

U.S. PATENT DOCUMENTS

| | | | | |
|---|---|---|---|---|
| 7,675,263 | B2 * | 3/2010 | Kawasumi et al. | ............ 320/112 |
| 7,977,916 | B2 * | 7/2011 | Hayakawa | ..................... 320/134 |
| 2011/0204850 | A1 * | 8/2011 | Kaino | ........................... 320/116 |
| 2012/0262180 | A1 * | 10/2012 | Ishishita | ...................... 324/430 |

FOREIGN PATENT DOCUMENTS

| | | |
|---|---|---|
| JP | 2007-124768 | 5/2007 |
| JP | 2009-254165 | 10/2009 |

* cited by examiner

*Primary Examiner* — Melissa Koval
*Assistant Examiner* — Stephen G Armstrong
(74) *Attorney, Agent, or Firm* — Wenderoth, Lind & Ponack, L.L.P.

(57) ABSTRACT

Application of rechargeable battery charging voltage is determined by a signal applied to a battery-connect terminal (94) from external electrical equipment. In the case of a charging voltage application, the current detection section is judged as malfunctioning when the maximum battery cell voltage detected as a time series rises from a voltage below 3.8V (the second voltage) to a voltage above 4.1V (the first voltage) even though rechargeable battery charging and discharging current detected as a time series is greater than −5 mA and less than 20 mA.

12 Claims, 6 Drawing Sheets

BATTERY PACK, METHOD OF DETERMINING MALFUNCTION, AND A MALFUNCTION DECISION CIRCUIT

BACKGROUND OF THE INVENTION

1. Field of the Invention

The present invention relates to a battery pack, to a method of determining malfunction that judges whether or not a current detection section, which detects rechargeable battery charging and discharging current, is operating abnormally, and to a malfunction decision circuit.

2. Description of the Related Art

State-of-the-art lithium ion battery charging (representative of rechargeable battery charging) charges batteries with a given current by constant current charging until the terminal voltage (referred to as battery voltage below) reaches a specified voltage set lower than the maximum allowable rechargeable battery voltage. Subsequently, charging switches to constant voltage charging. This is known as constant current-constant voltage charging and is the primary method in practice. If battery voltage exceeds the maximum battery voltage, battery lifetime and charging and discharging capacity degrade, and there is also risk of damage that even extends to battery combustion. Consequently, battery voltage is controlled during charging to avoid exceeding the maximum voltage.

Full-charge capacity is updated after each charge-discharge cycle based on the integral of the discharge current during discharge from full-charge to a voltage that halts discharging (revision-point voltage). The remaining capacity of a charged rechargeable battery is computed by subtracting the integral of the charging and discharging current (with positive current in the discharging direction) from the immediately prior revision of the full-charge capacity. Charging and discharging current is determined from the voltage drop across a current detection resistor connected in the charging and discharging path of the rechargeable battery. The computed remaining capacity is converted, for example, to a percentage of the full-charge capacity, and displayed to the operator.

When a high current flows that exceeds the rechargeable battery maximum allowable current, the result can extend to rechargeable battery failure such as over-heating, combustion, and explosion. For this reason, for example, the battery pack is provided with switching devices in the charging and discharging circuit path (refer to Japanese Laid-Open Patent Publication 2007-124,768). Here, when the voltage drop across the current detection resistor exceeds a specified voltage, the switching devices are switched OFF.

Accordingly, if for some reason the current detection resistor, which is indispensible for remaining capacity computation and over-current detection, fails due to a condition such as short circuit, not only is the ability to accurately determine remaining battery capacity lost, but also rechargeable battery safety is compromised.

In contrast, Japanese Laid-Open Patent Publication 2009-254,165 discloses a battery state detection circuit and battery pack that determines current detection circuit and/or voltage detection circuit failure. When rechargeable battery charging and discharging current detected by the current detection circuit, which has a current detection resistor, is effectively zero and the rechargeable battery terminal voltage detected by the voltage detection circuit is increasing, failure of either or both the current detection circuit and voltage detection is judged.

However, in the battery state detection circuit and battery pack cited in JP 2009-254,165, it cannot be determined if failure occurred in the voltage detection section or in the current detection section. In addition, the threshold for judging failure is not disclosed, and practical implementation is problematic.

The present invention was developed considering the situation described above. Thus, it is an object of the present invention to provide a method of determining malfunction that can reliably judge whether or not the current detection section has failed, and to provide a malfunction decision circuit and a battery pack.

SUMMARY OF THE INVENTION

The method of determining malfunction of the present invention determines voltage detection section and/or current detection section malfunction based on whether or not the detected voltage rises when the detected charging and discharging current is below a prescribed current. Determination is made by a malfunction decision circuit provided with a voltage detection section and a current detection section that detect rechargeable battery voltage and charging and discharging current respectively as time series. The method is characterized by judging current detection section malfunction when the detected voltage rises from below a second voltage, which is below a first voltage that is lower than the rechargeable battery full-charge voltage, to a voltage above the first voltage even though detected current is below the prescribed current.

In the method of determining malfunction of the present invention, whether or not the current detection section is malfunctioning is judged upon receipt of a signal indicating that rechargeable battery charging voltage has been applied.

In the method of determining malfunction of the present invention, the first voltage is the voltage where full-charge detection is started.

In the method of determining malfunction of the present invention, the second voltage is a voltage above the resume-charging voltage, which is the voltage where rechargeable battery charging is again started after detecting full-charge and halting charging.

In the method of determining malfunction of the present invention, the number of times that the voltage detected by the voltage detection section rises from a voltage below the second voltage to a voltage above the first voltage is counted, and the current detection section is judged as malfunctioning when the count becomes greater than or equal to a prescribed number.

In the method of determining malfunction of the present invention, the prescribed number of counts is set high for small difference between the first and second voltages and set low for a large difference between the first and second voltages.

In the method of determining malfunction of the present invention, evaluation of current detection section malfunction is not performed when the rise in detected voltage from a voltage below the second voltage to a voltage above the first voltage takes longer than a prescribed time.

The malfunction decision circuit of the present invention is provided with a voltage detection section and a current detection section that detect rechargeable battery voltage and charging and discharging current respectively as time series, and determines voltage detection section and/or current detection section malfunction based on whether or not the detected voltage rises when the detected charging and discharging current is below a prescribed current. Current detection section malfunction is judged when the voltage detected by the voltage detection section rises from a second voltage, which is below a first voltage that is lower than the rechargeable battery full-charge voltage, to a voltage above the first voltage even though detected current is below the prescribed current.

The malfunction decision circuit of the present invention is provided with an input section to receive a signal indicating that rechargeable battery charging voltage has been applied, and when the input section receives that signal, judgment of whether or not the current detection section is malfunctioning is made.

In the malfunction decision circuit of the present invention, the first voltage is the voltage where full-charge detection is started.

In the malfunction decision circuit of the present invention, the second voltage is a voltage above the resume-charging voltage, which is the voltage where rechargeable battery charging is again started after detecting full-charge and halting charging.

The malfunction decision circuit of the present invention is provided with a counter that counts the number of times that the voltage detected by the voltage detection section rises from a voltage below the second voltage to a voltage above the first voltage, and when the number of times counted by the counter becomes greater than or equal to a prescribed number, current detection section malfunction is judged.

The malfunction decision circuit of the present invention is provided with a timer that times the rise in voltage detected by the voltage detection section from a voltage below the second voltage to a voltage above the first voltage, and evaluation of current detection section malfunction is not performed when the elapsed time measured by the timer is greater than a prescribed time.

The battery pack of the present invention is provided with the malfunction decision circuit described above, and one or a plurality of rechargeable batteries with voltage and charging and discharging current each measured as a time series by the voltage detection section and the current detection section provided in the malfunction decision circuit.

In the present invention, when the charging and discharging current detected as a time series is below a prescribed current, there is a high probability that neither charging or discharging is being performed. However, if the battery voltage detected as a time series rises from a second voltage, which is below a first voltage that is lower than the full-charge voltage, to a voltage above the first voltage regardless of the low current, current detection section malfunction is judged. For example, in the case where a condition for full-charge requires rechargeable battery voltage to be at least greater than the first voltage, the prescribed current is set to a value sufficiently smaller than the charging current that should flow when the battery voltage becomes greater than the first voltage. As a result, current detection section malfunction is judged when rechargeable battery voltage rises from a voltage below the second voltage to a voltage above the first voltage and only a small charging current is detected that is below the prescribed current, which is sufficiently smaller than the charging current that should normally flow. On the other hand, the voltage detection section is not judged as malfunctioning because the detected voltage is within the range of voltages that should be attained by the rechargeable battery and varies normally in the vicinity of the first voltage near the upper end of that range.

In the present invention, judgment of whether or not the current detection section is malfunctioning is performed only when it is determined by a signal from the outside that rechargeable battery charging voltage has been applied. This prevents the current detection section from being mistakenly judged as malfunctioning during rechargeable battery discharge.

In the present invention, for example, the first voltage is the voltage where full-charge detection is started during constant current-constant voltage charging. The first voltage is the voltage at the upper end of the range of voltages through which rechargeable battery voltage should vary in the upward direction to determine current detection section malfunction. This insures that charging current flow when rechargeable battery voltage exceeds the first voltage is sufficiently greater than the prescribed current.

In the present invention, the second voltage is a voltage above the resume-charging voltage. The second voltage is the voltage at the lower end of the range of voltages through which rechargeable battery voltage should vary in the upward direction to determine current detection section malfunction. Consequently, when the rechargeable battery is continuously connected to a battery charger, whether or not the current detection section is malfunctioning is judged during each repetition of the detect full-charge, halt charging, discharge, and resume charging cycle.

In the present invention, when the charging and discharging current is below the prescribed current and the count of number of times the rechargeable battery voltage rises from the second voltage to the first voltage is greater than or equal to a prescribed number, the current detection section is judged as malfunctioning. Consequently, when the conditions for determining current detection section malfunction are met over a prescribed number of repeated cycles, the reliability for practical judgment of current detection section malfunction is improved.

In the present invention, the prescribed number of counts of rechargeable battery voltage rise from the second voltage to the first voltage is set depending on the voltage difference between the first voltage and the second voltage, and the smaller (or larger) the voltage difference, the higher (lower) the prescribed number of counts. This improves reliability for judging whether or not the current detection section is malfunctioning even when rechargeable battery voltage variation during voltage rise is small.

In the present invention, when the time required for rechargeable battery voltage rise from the second voltage to the first voltage is greater than a prescribed time, evaluation of current detection section malfunction is not performed. This prevents mistaken determination of current detection section malfunction when the rechargeable battery voltage rises due to charging and discharging currents that are so small they do not contribute to integration for computing charging and discharging capacity.

In the present invention, the voltage detection section and current detection section provided in the malfunction decision circuit described above detect rechargeable battery voltage and charging and discharging current as time series. This enables a malfunction decision circuit that can reliably determine current detection section malfunction to be applied in a battery pack.

In the present invention, the prescribed current is set to a current sufficiently smaller than the current that should flow when rechargeable battery voltage rises above the first voltage, which is below the full-charge voltage. Consequently, when only small charging and discharging current below the prescribed current (which is sufficiently smaller than the current that should normally flow) is detected when battery voltage rises from a voltage below the second voltage to a voltage above the first voltage, the current detection section is judged as malfunctioning. This allows reliable determination of whether or not the current detection section is malfunctioning. The above and further objects of the present invention as well as the features thereof will become more apparent from the following detailed description to be made in conjunction with the accompanying drawings.

DETAILED DESCRIPTION OF THE EMBODIMENTS

The following describes embodiments of the present invention based on the figures.

First Embodiment

Figure 1:
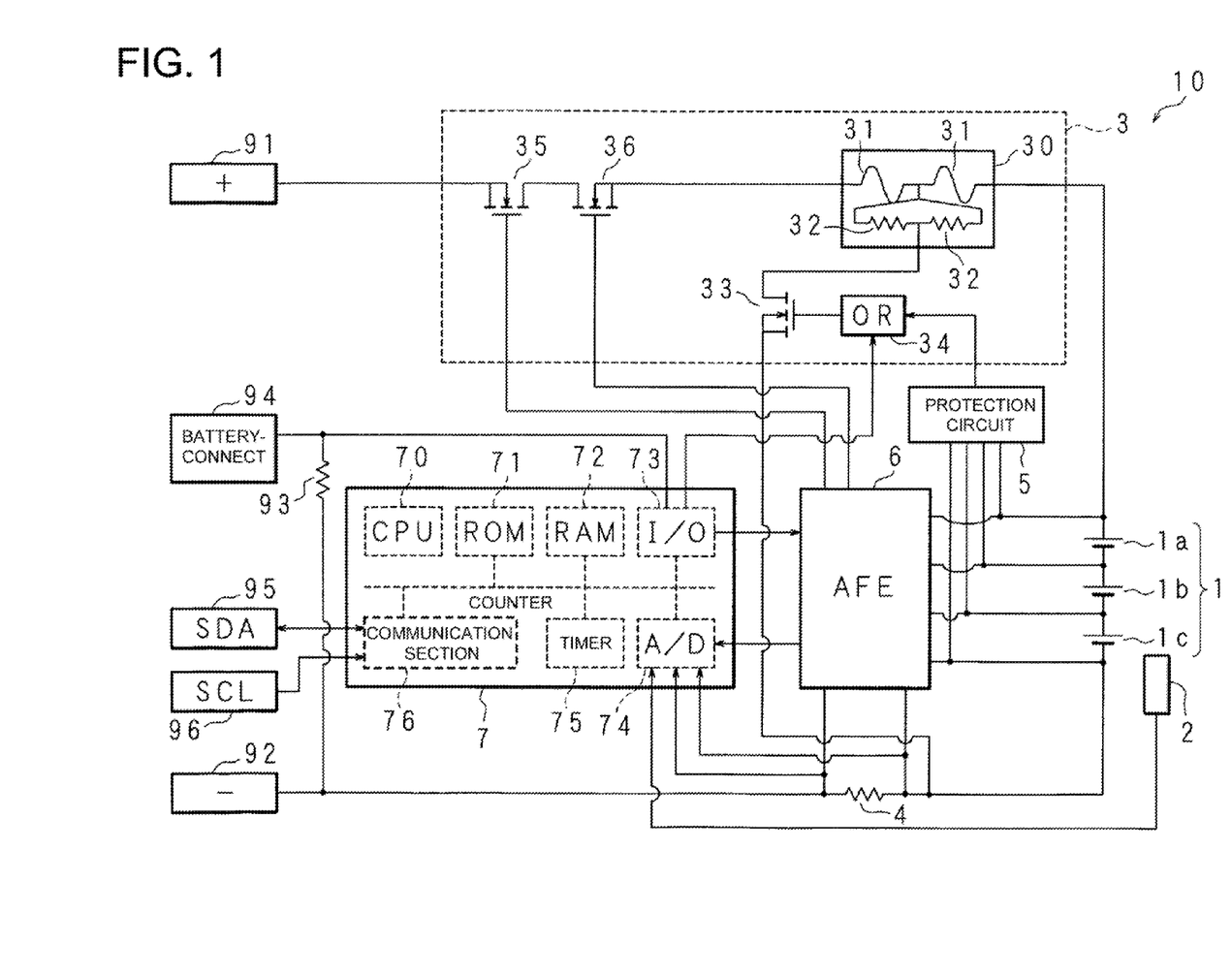
FIG. 1 is a block diagram showing an example of the circuit architecture for a battery pack of the present invention.

FIG. 1 is a block diagram showing an example of the circuit architecture for a battery pack of the present invention. The battery pack 10 of the figure is provided with a rechargeable battery 1 made up of battery cells 1a, 1b, 1c that are lithium ion batteries connected in series in that order, and a temperature sensor 2 that detects rechargeable battery temperature. The positive electrode terminal of battery cell 1a and the negative electrode terminal of battery cell 1c are equivalent to the positive and negative electrode terminals of the rechargeable battery 1. The rechargeable battery 1 can also be made up of other batteries such as nickel-hydride batteries or nickel cadmium batteries. Further, the number of rechargeable battery cells is not limited to three, and there could be one, two, or four or more battery cells as well.

The positive electrode terminal of the rechargeable battery 1 is connected to the positive (+) terminal 91 of the battery pack 10 through a cut-off section 3 that cuts-off rechargeable battery 1 charging and discharging current. The negative electrode terminal of the rechargeable battery 1 is connected to the negative (−) terminal 92 of the battery pack 10 through a current detection resistor 4 that detects rechargeable battery 1 charging and discharging current. The battery pack 10 connects in a detachable manner with electrical equipment (not illustrated) such as a personal computer or mobile device via the positive terminal 91, the negative terminal 92, and a battery-connect terminal 94 that is connected to the negative terminal 92 through a resistor 93. The circuit path from the positive terminal 91 to the negative terminal 92 through the cut-off section 3, the rechargeable battery 1, and the current detection resistor 4 is the circuit path for charging and discharging (referred to as the charging and discharging circuit path below).

The cut-off section 3 has a series connection of N-channel metal-oxide-semiconductor field-effect transistors (MOSFETs) (switching devices) 35, 36 that switch discharging and charging current respectively ON and OFF, and a non-resettable cut-off device 30 that has fuses 31, 31 connected in series between two of its terminals. This series connection is in turn connected between the positive electrode terminal of the rechargeable battery 1 and the positive terminal 91 of the battery pack 10. The MOSFETs 35, 36 can also be other switching devices such as bipolar transistors. During discharging and charging, (HIGH level) ON signals from an analog front end (AFE) 6 described later are applied to the gates of the MOSFETs 35, 36. The non-resettable cut-off device 30 has a parallel connection of heating resistors 32, 32 connected between the common node of the two fuses 31, 31 and the third terminal of the non-resettable cut-off device 30.

The cut-off section 3 also has an N-channel MOSFET 33 with its drain connected to the third terminal of the non-resettable cut-off device 30, and an OR circuit 34 with its output connected to the gate of the MOSFET 33. The source of the MOSFET 33 is connected to the negative electrode terminal of the rechargeable battery 1. When OR circuit output becomes a HIGH level, the MOSFET 33 conducts between source and drain and applies rechargeable battery 1 voltage and/or externally applied voltage through the fuses 31, 31 to the heating resistors 32, 32 to melt the fuses 31, 31. This cuts-off charging and discharging circuit path current in a non-reversible manner. However, elements in the non-resettable cut-off device 30 for the purpose of cutting-off current through the charging and discharging circuit path are not limited to fuses.

The positive and negative terminals of each battery cell 1a, 1b, 1c are connected to the input terminals of a protection circuit 5 to detect any over-voltage condition in the battery cells and issue a detection signal to the OR circuit 34. The terminals of each battery cell 1a, 1b, 1c are also connected to the input terminals of an analog front end (AFE) 6 that switches battery cell 1a, 1b, 1c voltages for input to a control section 7, which is a microcomputer. Other input terminals of the AFE 6 are connected to both sides of the current detection resistor 4.

The protection circuit 5 is provided with separate comparator and timer sub-circuits (not illustrated). Comparators compare battery cell 1a, 1b, 1c voltages with a reference voltage. In the present embodiment, this reference voltage is 4.3V, but it is not limited to that voltage. When any one of the comparators determines a battery cell 1a, 1b, 1c voltage greater than 4.3V, it outputs a signal that starts a timer. When the timer elapsed time reaches, for example, 1.5 sec, rechargeable battery over-voltage is determined and a detection signal is issued to one of the OR circuit inputs. As a result, the fuses 31, 31 in the cut-off section 3 are fused open and the rechargeable battery 1 charging and discharging circuit path is cut-off.

The AFE 6 contains a comparator (not illustrated) and detects rechargeable battery 1 over-current by comparing the voltage across the current detection resistor 4 with a reference voltage. When over-current is detected, (LOW level) OFF signals are applied to the gates of the MOSFETs 35, 36 to cut-off current flow in the charging and discharging circuit path. In addition, the AFE 6 applies OFF signals to the MOSFETs 35, 36 when a charging and discharging circuit path cut-off signal (the result of logically ANDing an over-voltage detection signal with a current detection section signal indicating detection of an abnormality) is received from an input-output (I/O) port 73.

The control section 7 has a central processing unit (CPU) 70. The CPU 70 is connected via bus lines with read-only memory (ROM) 71 that stores programs and data, random access memory (RAM) 72 that temporarily stores generated data, an I/O port 73 that outputs charging and discharging circuit path cut-off signals to one input of the OR circuit 34 and to the AFE 73 and inputs battery-connect terminal 94 voltage, an analog-to-digital (A/D) converter 74 that converts analog voltages to digital values, a timer 75 that measures elapsed time, and a communication section 76 to communicate with externally connected electrical equipment. The timer 75 is provided with two independent timer units (timer-A and timer-B).

The A/D converter 74 converts battery cell 1*a*, 1*b*, 1*c* voltages input from the AFE 6, voltage input from the temperature sensor 2, and the voltage across the current detection resistor 4 to digital values. The communication section 76 is connected to a serial data (SDA) terminal 95 to exchange data with external electrical equipment, and a serial clock (SCL) terminal 96 to receive associated clock signals. The communication section 76 and the external electrical equipment can also communicate according to other protocols or standards.

In the circuit structure of the battery pack 10 described above, the malfunction decision circuit is equivalent to the circuit structure without the rechargeable batteries 1, temperature sensor 2, cut-off section 3, protection circuit 5, and resistor 93. The voltage detection section is equivalent to the AFE 6 and part of the A/D converter 74. The current detection section is equivalent to the current detection resistor 4 and part of the A/D converter 74. The input section is equivalent to the resistor 93 and part of the I/O port 73, and the timer is equivalent to the timer 75.

The CPU 70 operates according to a control program pre-stored in ROM 71 to perform processing such as computation and input-output operations. For example, the CPU 70 reads-in current detection resistor 4 voltage as a time series via the A/D converter 74, integrates charging and discharging current converted from the resistor voltage to determine the remaining capacity of the rechargeable battery 1, and also generates remaining capacity data. The generated remaining capacity data is sent to the external electrical equipment via the communication section 76. Note, current within a range from −5 mA (discharging direction) to 20 mA (charging direction) is neglected and not detected as charging or discharging current. This is based on consideration of A/D converter 74 conversion error and the existence of internal battery pack 10 current that appears as charging current.

The CPU 70 also reads-in temperature sensor 2 voltage as a time series with a sampling period such as 250 msec via the A/D converter 74, and detects battery temperature based on the temperature sensor voltage. Further, the CPU 70 detects battery cell 1*a*, 1*b*, 1*c* voltages issued to the A/D converter 74 from the AFE 6 as time series with a 250 msec sampling period. The highest detected battery cell voltage (referred to below as the maximum cell voltage) is identified and saved in RAM 72. Although the normal-mode sampling period is 250 msec, it is not limited to that rate and, for example, can be 5 sec in a low-power-mode.

Figure 2:
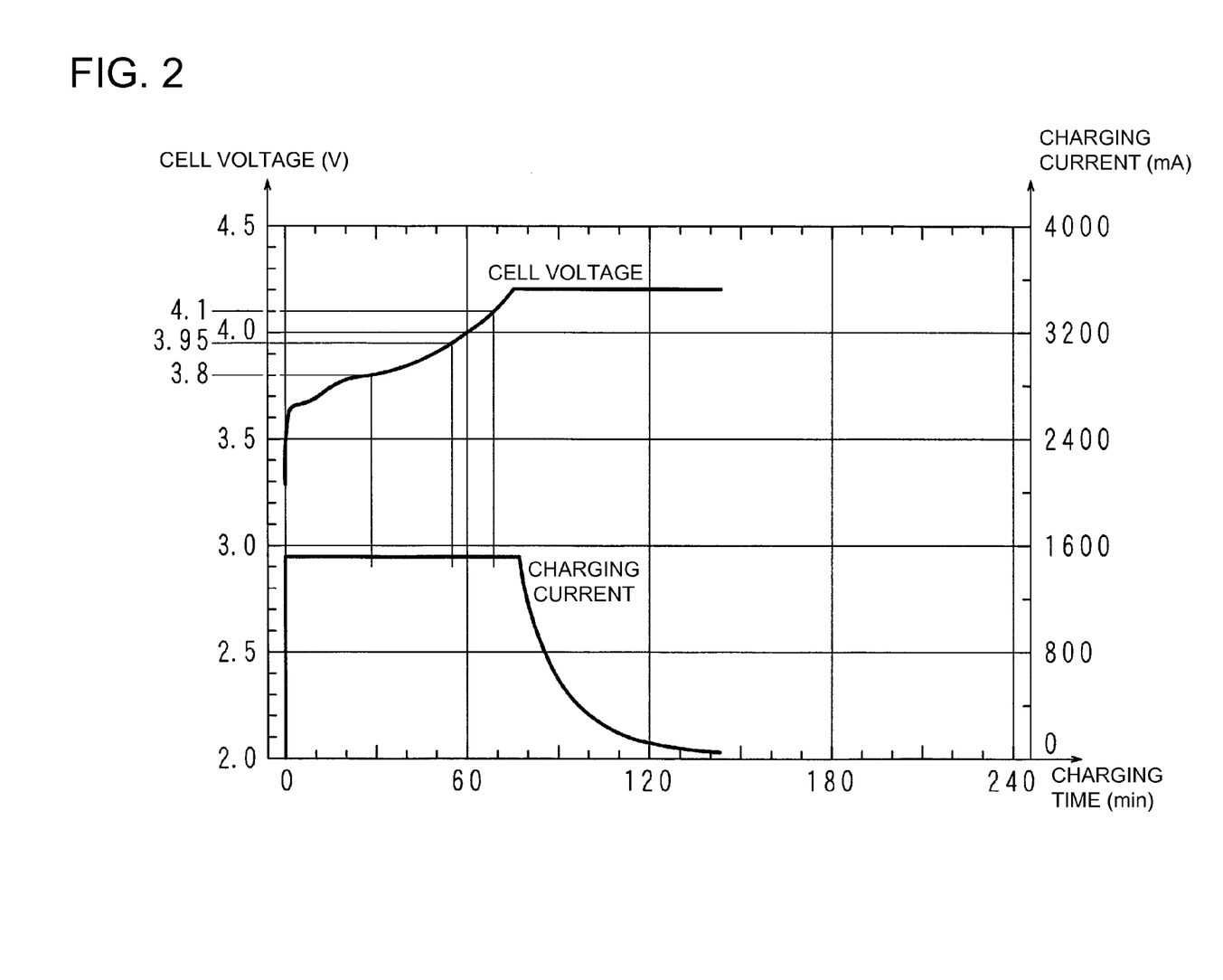
FIG. 2 is a graph showing battery cell voltage and charging current characteristics as a function of charging time for a representative (average) battery cell.

The following describes the relation between cell voltage and charging current during battery charging. FIG. 2 is a graph showing battery cell 1*a*, 1*b*, 1*c* voltage and charging current characteristics as a function of charging time for a representative (average) battery cell. In FIG. 2, the horizontal axis is charging time in minutes, and the vertical axes show battery cell voltage (V) and charging current (mA) for one of the battery cells 1*a*, 1*b*, 1*c*. The curves in the figure show constant current (1.5 mA), constant voltage (4.2V) charging characteristics for one of the battery cells 1*a*, 1*b*, 1*c* with a design capacity of approximately 2250 mAh.

As shown in FIG. 2, when battery cell voltage rises and approaches the charging voltage (4.2V), charging current decreases continuously in an initially rapidly decaying manner. Paying particular attention to the charging current during cell voltage rise prior to reaching the charging voltage, it is noted for example, that the charging current at both 3.8V and 3.95 is approximately constant at 2.95 A. From this it is clear that current significantly greater than the minimum current detectable as charging current (20 mA) flows continuously in this (voltage-rise) region of the characteristics.

In the first embodiment, full-charge is detected during charging when the maximum cell voltage exceeds the voltage where full-charge detection is started (initiate-full-charge-detection voltage, for example, 4.1V) and the charging current drops below a full-charge detection threshold current (for example, 50 mA) for a given time period (for example, 20 sec) or longer. After full-charge is detected, rechargeable battery 1 charging is suspended during the period when maximum cell voltage drops from the full-charge voltage (4.2V in this case) to a resume-charging voltage (for example, 3.95). If charging and discharging current is below a prescribed current and maximum cell voltage initially drops below a set voltage (the second voltage) below the resume-charging voltage and subsequently rises to a voltage (the first voltage) above the initiate-full-charge-detection voltage, the CPU 70 judges the current detection section as malfunctioning. As a result, OFF signals are issued to the MOSFETs 35, 36 to cut-off the rechargeable battery 1 charging and discharging circuit path, and the cut-off section 3 fuses 31, 31 are fused open to also cut-off the rechargeable battery 1 charging and discharging circuit path. Here, when the current detection section is judged as malfunctioning and A/D converter 74 reliability is high, failure of the current detection resistor 4 can be assumed.

Figure 3:
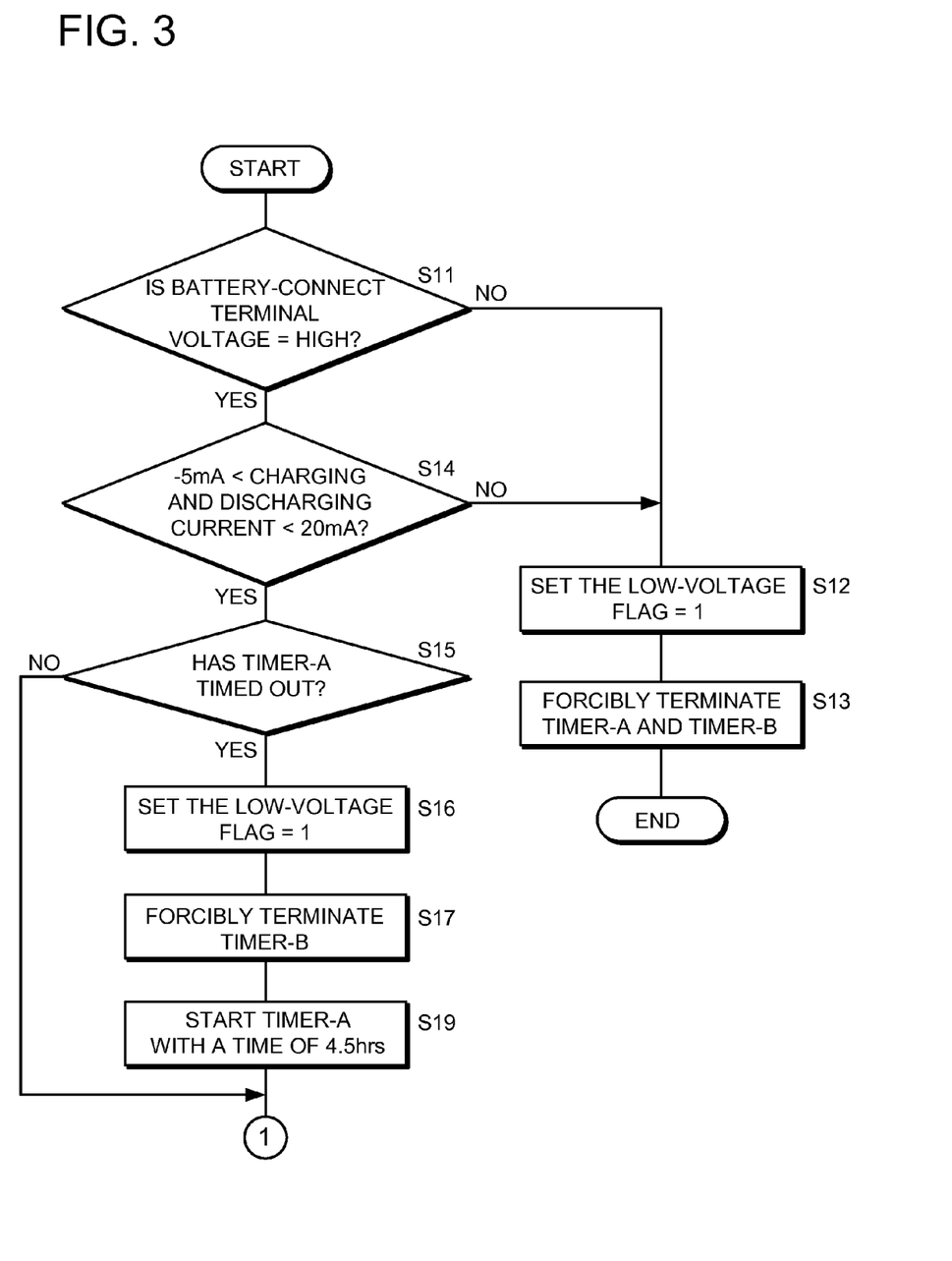
FIG. 3 is a flow-chart showing CPU processing steps to detect current detection section malfunction when the maximum cell voltage rises from 3.8V to 4.1V.
Figure 4:
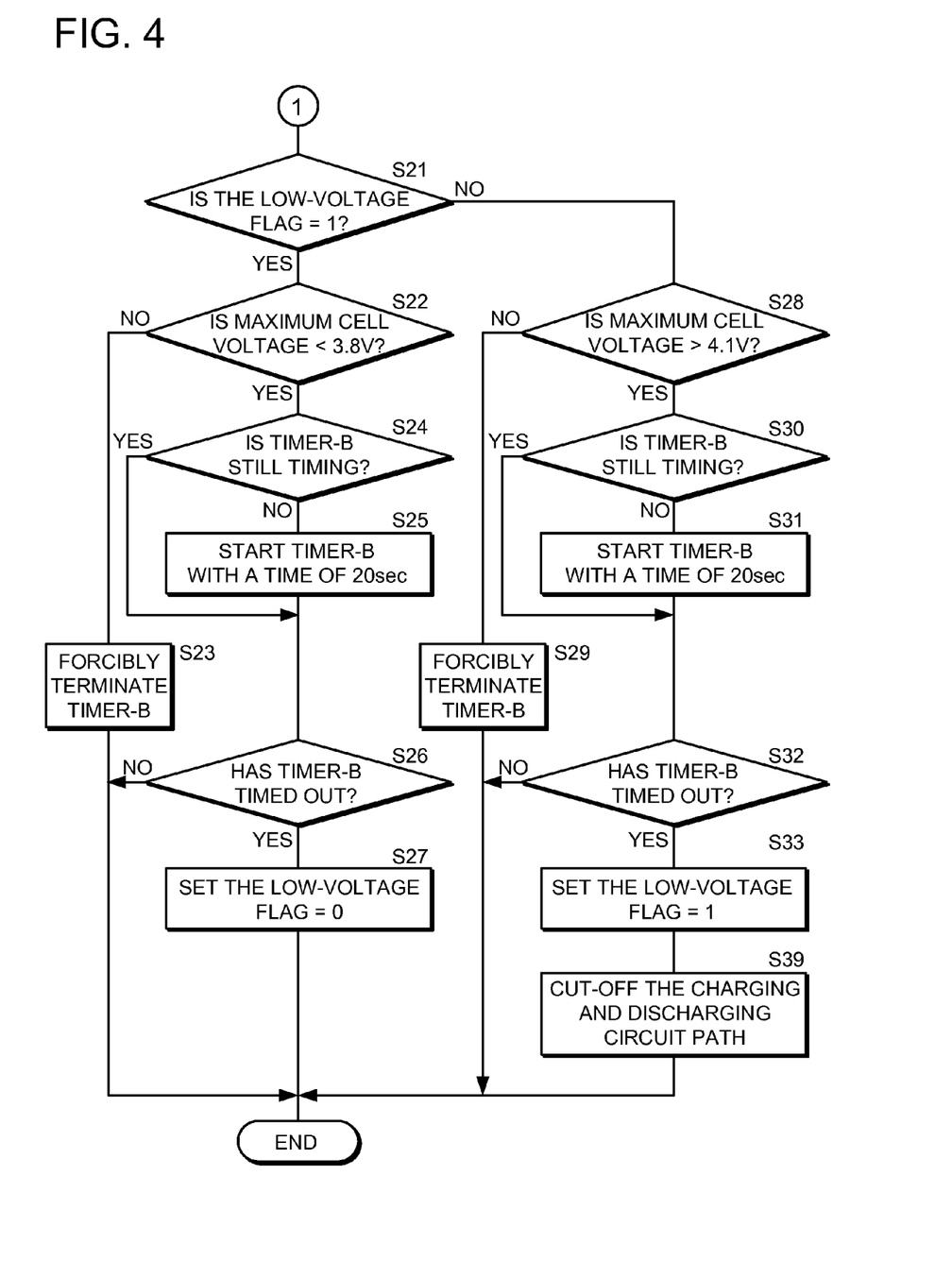
FIG. 4 is a flow-chart showing CPU processing steps to detect current detection section malfunction when the maximum cell voltage rises from 3.8V to 4.1V (and is a continuation of the flow-chart of FIG. 3).

The following describes operation of the control section 7 of the battery pack 10 described above based on flow-charts. The operations described below are executed by the CPU 70 according to a control program pre-stored in ROM 71. FIGS. 3 and 4 are flow-charts showing CPU 70 processing steps to detect current detection section malfunction when the maximum cell voltage rises from 3.8V to 4.1V. The processing steps in FIG. 3 are executed with a 250 msec period, but execution is not limited to that periodicity.

The maximum cell voltage used in FIG. 4 processing is the value written-to RAM 72 with the previously mentioned 250 msec periodicity. The low-voltage flag is a logic flag stored in RAM indicating the processing regime where maximum cell voltage is compared with 3.8V (the second voltage) or the processing regime where maximum cell voltage is compared with 4.1V (the first voltage). Timer-A of the timer 75 monitors the time required to detect current detection section malfunction and timer-B is a multi-use timer to measure the time that the maximum cell voltage is below 3.8V, and the time it is above 4.1V.

When FIG. 3 processing is initiated, the CPU 70 first reads-in the battery-connect terminal 94 voltage via the I/O port 73 and in step eleven (S11) judges whether or not that voltage is a HIGH level. This enables reliable determination of whether or not charging is being performed by externally connected electrical equipment. If the voltage applied to the battery-connect terminal 94 is not HIGH (S11: NO), the CPU 70 sets the low-voltage flag to 1 (S12) and unconditionally forces termination of timer-A and timer-B. This initializes the timer 75 and the low-voltage flag indicating the processing regime, and ends FIG. 3 processing.

If the voltage read-in at (S11) is a HIGH level (S11: YES), the CPU 70 reads-in the charging current converted to a digital value by the A/D converter 74 and in (S14) judges whether or not the charging current is greater than −5 mA (discharging current) and less than 20 mA (charging current). If charging current is less than or equal to −5 mA or greater than or equal to 20 mA (S14: NO), CPU 70 control moves to (S12) for initialization. Note, the value of the comparison current in (S14) is not limited to a range from −5 mA to 20 mA, and charging current could also be compared with any current range having an absolute value that is significantly smaller than 2.95 A for example, which is the current of that flows when maximum cell voltage is 4.1V.

If the charging and discharging current is greater than −5 mA and less than 20 mA (S14: YES), the CPU 70 judges whether or not timer-A (in the timer 75) has timed out, which includes forced termination (S15). If timer-A has not timed out and is still running, control jumps to (S21) described later. If timer-A has timed out (S15: YES), which is when (S15) is executed for the first time or when the timer has timed out, the CPU 70 sets the low-voltage flag to 1 (S16) to indicate the processing regime where maximum cell voltage is compared with 3.8V. Subsequently, the CPU 70 forces termination of timer-B (S17), and starts timer-A with a time set for 4.5 hrs (S19). Consequently, if the time required to detect current detection section malfunction exceeds 4.5 hrs, processing moves from the regime where maximum cell voltage is compared with 3.8V to a sequence that re-starts detection of current detection section malfunction.

Setting the time to 4.5 hrs in (S19) is based on consideration of the possibility that battery cell 1a, 1b, 1c voltage can gradually rise due to (trickle) current at or below 20 mA that is not detected as charging current. For battery cells 1a, 1b, 1c with a design capacity of 2250 mAh and where a cell voltage of 3.8V is approximately 50% remaining capacity, when a battery cell with a remaining capacity of 1125 mAh is charged by a typical battery charger, maximum cell voltage is estimated to reach 4.1V within 4.5 hrs.

Turning to FIG. 4, the CPU 70 judges whether or not the low-voltage flag is set to 1 (S21). When the low-voltage flag is set to 1 (S21: YES), the CPU 70 judges whether or not the maximum cell voltage is less than 3.8V (S22). If the maximum cell voltage is not less than 3.8V (S22: NO), the CPU 70 unconditionally forces termination of timer-B (S23), and ends FIG. 4 processing. If the maximum cell voltage is less than 3.8V (S22: YES), the CPU 70 judges whether or not timer-B (in the timer 75) is still timing (S24). If timer-B is still timing (S24: YES), processing advances to (S26) described below.

If timer-B is not still timing (S24: NO), the CPU 70 starts timer-B with a running time of 20 sec (S25). Subsequently, the CPU 70 judges whether or not timer-B has timed out (S26), and directly ends FIG. 4 processing if timer-B has not timed out (S26: NO). If timer-B has timed out (S26: YES), specifically if the maximum cell voltage has remained below 3.8V for 20 sec or more, the low-voltage flag is set to 0 (S27), FIG. 4 processing is ended, and CPU 70 control shifts to the processing regime where maximum cell voltage is compared with 4.1V.

If the low-voltage flag in (S21) is not set to 1 (S21: NO), the CPU 70 judges whether or not the maximum cell voltage is greater than 4.1V (S28). If the maximum cell voltage is not greater than 4.1V (S28: NO), the CPU 70 unconditionally forces termination of timer-B (S29), and ends FIG. 4 processing. If the maximum cell voltage is greater than 4.1V (S28: YES), the CPU 70 judges whether or not timer-B (in the timer 75) is still timing (S30). If timer-B is still timing (S30: YES), processing advances to (S32) described below.

If timer-B is not still timing (S30: NO), the CPU 70 starts timer-B with a running time of 20 sec (S31). Subsequently, the CPU 70 judges whether or not timer-B has timed out (S32), and directly ends FIG. 4 processing if timer-B has not timed out (S32: NO). If timer-B has timed out (S32: YES), specifically if the maximum cell voltage has remained above 4.1V for 20 sec or more, the CPU 70 sets the low-voltage flag to 1 (S33) and issues cut-off signals from the I/O port 73 to the OR circuit 34 and AFE 6 to cut-off the charging and discharging circuit path (S39). As a result, the MOSFETs 35, 36 are switched OFF and the fuses 31, 31 are fused open to completely cut-off the rechargeable battery 1 charging and discharging circuit path.

In accordance with the first embodiment described above, when the maximum cell voltage detected as a time series rises from a voltage below 3.8V (the second voltage) to a voltage above 4.1V (the first voltage) even though the charging current detected as a time series is greater than −5 mA and less than 20 mA, the current detection section is detected as malfunctioning. Here, charging and discharging current in the range from −5 mA to 20 mA is sufficiently smaller than the current (2.95 A) that should flow when the maximum cell voltage rises above 4.1V. Accordingly, when rechargeable battery voltage increases from a voltage below the second voltage to a voltage above the first voltage and only a small charging and discharging current is detected below the prescribed current, which is small compared to the current that should flow, the current detection section is detected as malfunctioning.

In addition, judgment of whether or not the current detection section is malfunctioning is performed only when application of rechargeable battery charging voltage is confirmed by a signal from external electrical equipment at the battery-connect terminal. This makes it possible to avoid mistaken judgment of current detection section malfunction during discharging of the rechargeable battery.

Further, when the time required for rechargeable battery voltage to rise from 3.8V to 4.1V exceeds 4.5 hrs, no judgment is made of whether or not the current detection section has malfunctioned. This makes it possible to avoid mistaken judgment of current detection section malfunction when rechargeable battery voltage rises as a result of charging and discharging currents that are so small they do not contribute to integrated charging and discharging capacity computations.

Still further, rechargeable battery voltage and charging and discharging current are detected as time series by the malfunction decision circuit voltage detection section and current detection section respectively. This makes it possible to implement a malfunction decision circuit in a battery pack that can reliably determine if the current detection section is operating normally or malfunctioning.

Second Embodiment

In the first embodiment, the second voltage is lower than the resume-charging voltage (3.95V). In addition, the first embodiment judges that the current detection section has malfunctioned when charging and discharging current is less than the prescribed current and the maximum cell voltage rises one time from a voltage below the second voltage to a voltage above the first voltage. In contrast, the second embodiment judges that the current detection section has malfunctioned when charging and discharging current is less than the prescribed current and the maximum cell voltage rises several times from a voltage below a second voltage, which is greater than or equal to the resume-charging voltage, to a voltage above the first voltage.

The battery pack 10 structure for the second embodiment and battery cell 1a, 1b, 1c voltage and charging current characteristics as a function of charging time are the same as in the first embodiment, and their detailed description is abbreviated.

Figure 5:
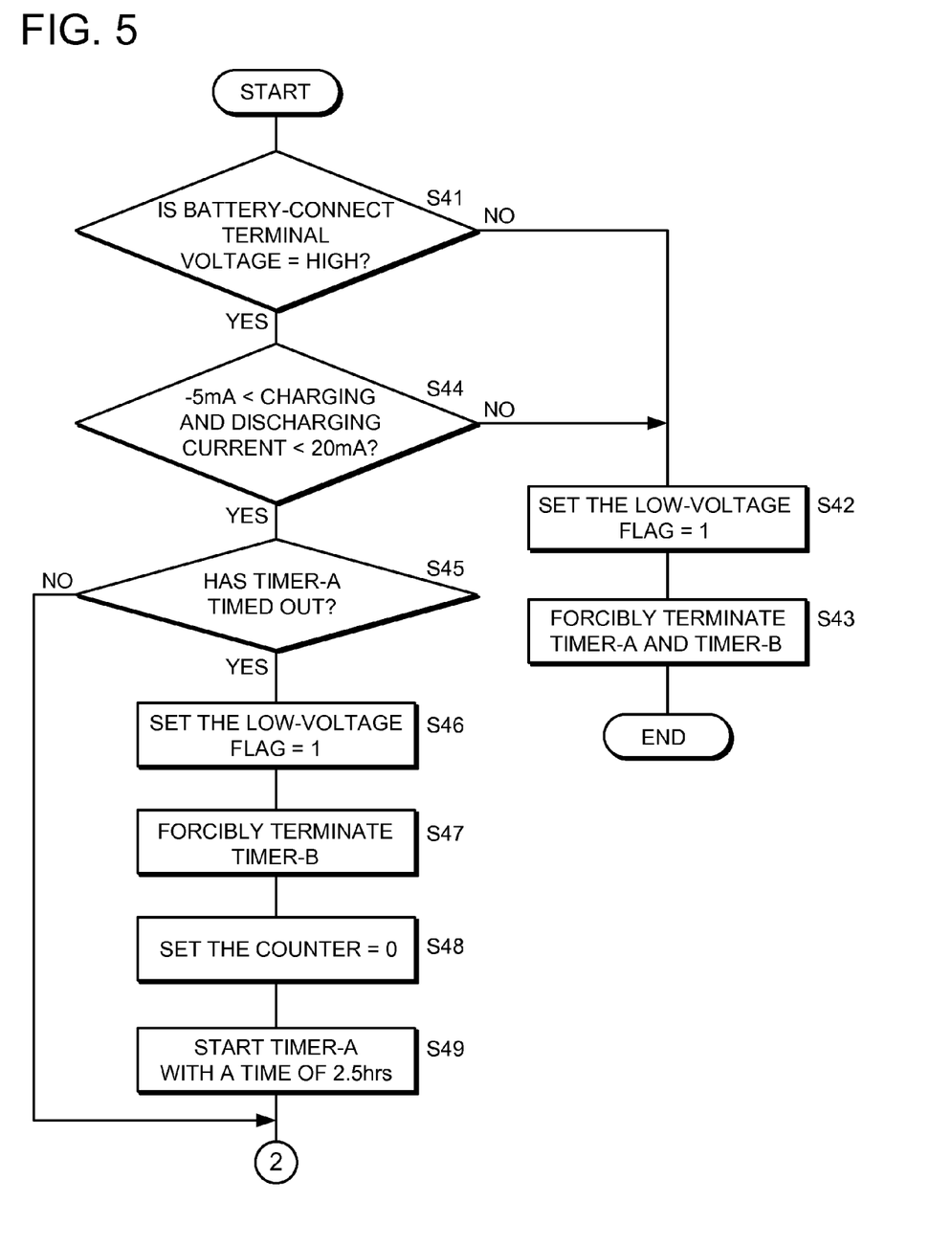
FIG. 5 is a flow-chart showing CPU processing steps to detect current detection section malfunction when the maximum cell voltage rises three times from 3.95V to 4.1V.
Figure 6:
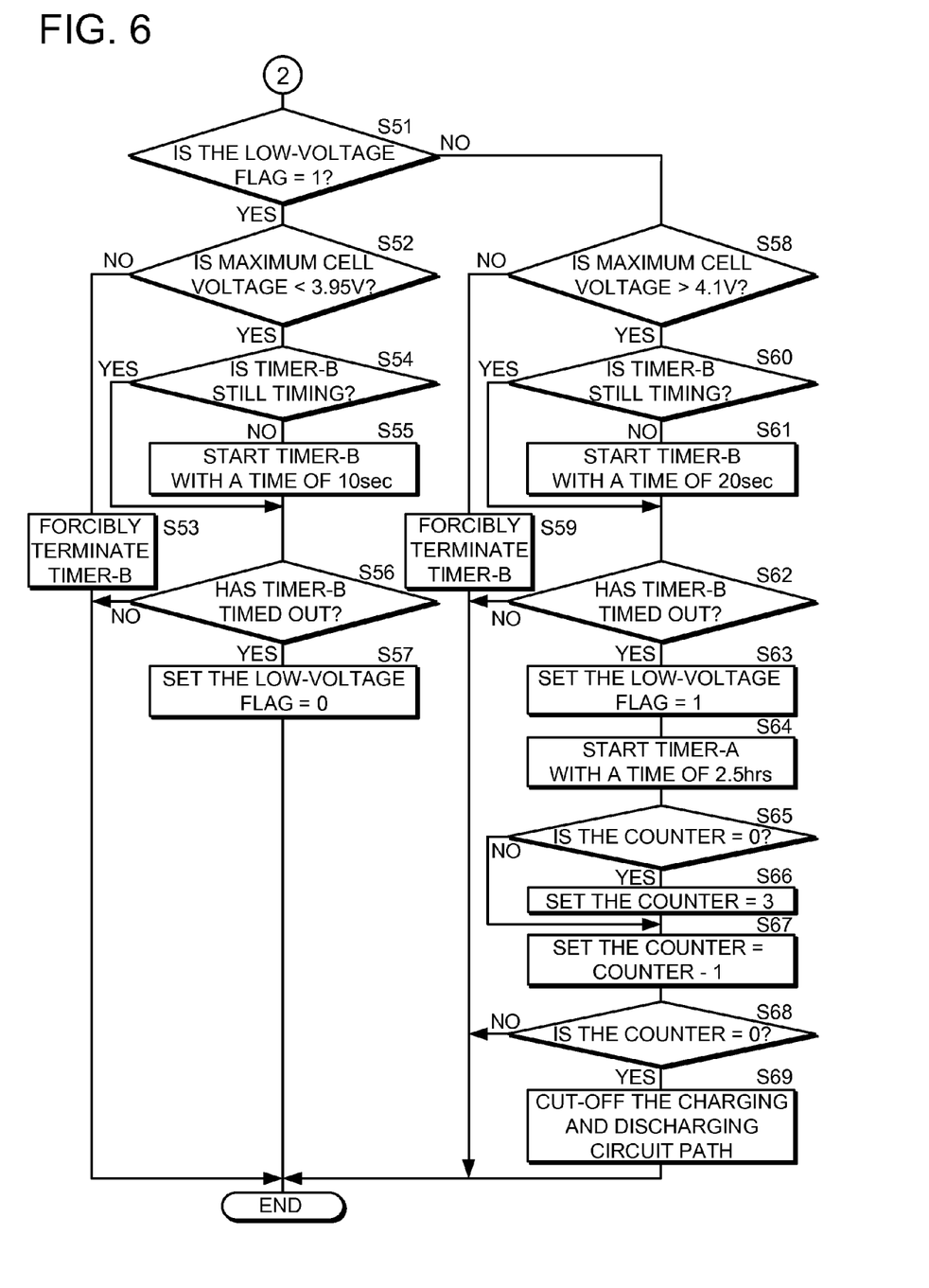
FIG. 6 is a flow-chart showing CPU processing steps to detect current detection section malfunction when the maximum cell voltage rises three times from 3.95V to 4.1V (and is a continuation of the flow-chart of FIG. 5).

FIGS. 5 and 6 are flow-charts showing CPU 70 processing steps to detect current detection section malfunction when the maximum cell voltage rises three times from 3.95V to 4.1V. FIG. 5 processing is performed with a 250 msec period, but is not limited to that periodicity. Here, the low-voltage flag indicates the processing regime where maximum cell voltage is compared with 3.95V (the second voltage) or the processing regime where maximum cell voltage is compared with 4.1V (the first voltage). The counter counts the number of times the maximum cell voltage rises from a voltage below the second voltage to a voltage above the first voltage, and that count is stored in RAM 72.

Other than steps (S48) and (S49), the processing flow in FIG. 5 from (S41) to (S47) is the same as the flow in FIG. 3 from (S11) to (S17), and description of that processing is in general abbreviated. When FIG. 5 processing is initiated and flow progresses to (S45), the CPU 70 judges whether or not timer-A has timed out. If timer-A has timed out (S45: YES) the CPU 70 sets the low-voltage flag to 1 (S46), forces termination of timer-B (S47), and sets the counter to zero (S48) to initialize count of the number of voltage rise cycles. Subsequently, The CPU 70 starts timer-A to monitor the time required to determine current detection section malfunction with a time set for 2.5 hrs (S49), and processing moves to (S51) in FIG. 6.

Other than steps (S52), (S55), and (S64) through (S68), the processing flow in FIG. 6 from (S51) to (S69) is the same as the flow in FIG. 4 from (S21) to (S39), and description of that processing is in general abbreviated. Specifically, FIG. 6 is different from FIG. 4 in that step (S52) of FIG. 6 compares maximum cell voltage with 3.95V while step (S22) of FIG. 4 compares maximum cell voltage with 3.8V. In addition, step (S55) of FIG. 6 starts timer-B with a time of 10 sec while step (S25) of FIG. 4 starts timer-B with a time of 20 sec. Note in step (S52), maximum cell voltage could as well be compared with a voltage greater than 3.95V (but less than 4.1V).

Further, FIG. 6 processing is different from FIG. 4 processing in that steps (S64) through (S68) are added. In step (S62), if timer-B has timed out (S62: YES), which is when the maximum cell voltage has remained above 4.1V for 20 sec or more, the CPU 70 sets the low-voltage flag to 1 (S63), and subsequently starts timer-A with a time set for 2.5 hrs (S64). This re-initiates timer-A monitoring for 2.5 hrs.

Next, the CPU 70 determines whether or not the counter is 0 (S65), namely the CPU 70 determines whether or not counting using the counter has started. If the counter is not 0 and counting has already started (S65: NO), CPU 70 control moves to step (S67) described below. If the counter is 0 (S65: YES), the CPU 70 stores 3 in counter memory as an initial value (S66). Note, this initial value is not limited to 3, and can also be an integer value of 2, or 4 or more.

Next, the CPU 70 decrements the counter by 1 (S67), and determines whether or not the counter has become 0 (S68). If the counter has not become 0 (S68: NO), FIG. 6 processing is directly ended. If the counter has become 0 (S68: YES), the CPU 70 issues charging and discharging circuit path cut-off signals from the I/O port 73 to the OR circuit 34 and AFE 6 (S69). As a result, the MOSFETs 35, 36 are switched OFF and the fuses 31, 31 are fused open to completely cut-off the rechargeable battery 1 charging and discharging circuit path.

Other elements of the second embodiment corresponding to elements in the first embodiment are identified by the same label, and their detailed description is abbreviated.

As described above in the second embodiment, the second voltage is a voltage greater than or equal to the resume-charging voltage (3.95V). Accordingly, when the rechargeable battery is continuously connected to a battery charger, it is possible to judge whether or not the current detection section is malfunctioning each time the detect full-charge, halt charging, discharge, and resume charging cycle is repeated.

Further, the current detection section is judged as malfunctioning when the charging and discharging current is between −5 mA and 20 mA, and the maximum cell voltage rises from the second voltage to the first voltage three times. Consequently, when the conditions for determining current detection section malfunction are met over a prescribed number of repeated cycles, it is possible to increase the reliability for practical judgment of current detection section malfunction.

Although the number of times the maximum cell voltage rises from the second voltage to the first voltage is three times in the second embodiment, it is not limited to that number. For example, the smaller (or larger) the voltage difference between the first voltage and second voltage, the higher (lower) the number of counts can be set for rechargeable battery voltage rise from the second voltage to the first voltage. When the prescribed number of counts is set in this manner, it is possible to increase the reliability for judging whether or not the current detection section is malfunctioning even if there is only a small amount of voltage change during rechargeable battery voltage rise.

In the first and second embodiments, timer-A is used to monitor the time required to detect current detection section malfunction, and timer-B is used to time the period that maximum cell voltage is below the second voltage and the period that maximum cell voltage is above the first voltage. However, the present invention is not limited to that arrangement. For example, separate counters can be provided instead of timer-A and timer-B. Here, when a counter loaded with an appropriate count value is successively (and periodically) decremented and becomes zero, it is equivalent to timer-A or timer-B timing out.

Also in the first and second embodiments, timer-B is set to a monitoring time of 20 sec or 10 sec. However, the timer is not limited to those times, and can be set to any appropriate monitoring time.

Finally, in the first and second embodiments, although the first voltage, which is below the full-charge voltage, is the same as the voltage where full-charge detection is started (4.1V), it is not limited to that voltage. However, it is desirable to make the first voltage equivalent to the voltage where full-charge detection is started to insure that the flow of charging current when maximum cell voltage exceeds the first voltage sufficiently greater than −5 mA to 20 mA.

It should be apparent to those of ordinary skill in the art that while various preferred embodiments of the invention have been shown and described, it is contemplated that the invention is not limited to the particular embodiments disclosed, which are deemed to be merely illustrative of the inventive concepts and should not be interpreted as limiting the scope of the invention, and which are suitable for all modifications and changes falling within the spirit and scope of the invention as defined in the appended claims. The present application is based on Application No. 2011-102,302 filed in Japan on Apr. 28, 2011, the content of which is incorporated herein by reference.

What is claimed is:

1. A method of determining malfunction that detects rechargeable battery voltage and charging and discharging current as a time series with a voltage detection section and a current detection section provided in a malfunction decision circuit, and judges whether or not the current detection section is malfunctioning, the method comprising:
    detecting rechargeable battery voltage and charging and discharging current as a time series with the voltage detection section and the current detection section, respectively; and
    judging whether or not there is a malfunction based on whether or not the voltage detected by the voltage detection section rises while the charging and discharging current detected by the current detection section is below a prescribed current,
    wherein the current detection section is judged as malfunctioning when the voltage detected by the voltage detection section rises from a voltage below a second voltage, which is below a first voltage that is lower than the rechargeable battery full-charge voltage, to a voltage above the first voltage,
    wherein the number of times that the voltage detected by the voltage detection section rises from a voltage below the second voltage to a voltage above the first voltage is counted, and
    wherein the current detection section is judged as malfunctioning when the count becomes greater than or equal to a prescribed number.

2. The method of determining malfunction as cited in claim 1 wherein judgment of whether or not the current detection section is malfunctioning is performed upon receipt of a signal indicating that rechargeable battery charging voltage has been applied.

3. The method of determining malfunction as cited in claim 1 wherein the first voltage is the voltage where full-charge detection is started.

4. The method of determining malfunction as cited in claim 1, wherein the second voltage is a voltage above a resume-charging voltage, which is a voltage where rechargeable battery charging is again started after a full-charge is detected and charging is halted.

5. The method of determining malfunction as cited in claim 1, wherein the prescribed number of counts is set high for small difference between the first and second voltages and set low for a large difference between the first and second voltages.

6. The method of determining malfunction as cited in claim 1 wherein judgment of whether or not the current detection section is malfunctioning is not performed when the rise in detected voltage from a voltage below the second voltage to a voltage above the first voltage takes longer than a prescribed time.

7. A malfunction decision circuit comprising:
    a voltage detection section that detects rechargeable battery voltage as a time series;
    a current detection section that detects rechargeable battery charging and discharging current as a time series;
    a decision section that judges whether or not the current detection section is malfunctioning based on whether or not the voltage detected by the voltage detection section rises when the charging and discharging current detected by the current detection section is below a prescribed current; and
    a counter that counts the number of times that the voltage detected by the voltage detection section rises from a voltage below a second voltage, which is below a first voltage that is lower the than a rechargeable battery full-charge voltage, to a voltage above the first voltage,
    wherein the current detection section is judged as malfunctioning when the count becomes greater than or equal to a prescribed number.

8. The malfunction decision circuit as cited in claim 7 further comprising an input section to receive a signal indicating that rechargeable battery charging voltage has been applied,
    wherein when the input section receives that signal, judgment of whether or not the current detection section is malfunctioning is performed.

9. The malfunction decision circuit as cited in claim 7 wherein the first voltage is the voltage where full-charge detection is started.

10. The malfunction decision circuit as cited in claim 7 wherein the second voltage is a voltage above the resume-charging voltage, which is the voltage where rechargeable battery charging is again started after detecting full-charge and halting charging.

11. The malfunction decision circuit as cited in claim 7, further comprising a timer that times the rise in voltage detected by the voltage detection section from a voltage below the second voltage to a voltage above the first voltage,
    wherein judgment of whether or not the current detection section is malfunctioning is not performed when an elapsed time measured by the timer is greater than a prescribed time.

12. A battery pack comprising the malfunction decision circuit as cited in claim 7, and one or a plurality of rechargeable batteries with voltage and charging and discharging current each measured as a time series by the voltage detection section and the current detection section provided in the malfunction decision circuit.

* * * * *